United States Patent [19]
Park

[11] Patent Number: 6,081,168
[45] Date of Patent: Jun. 27, 2000

[54] VOLTAGE CONTROLLED OSCILLATOR FOR UPCONVERTER/DOWNCONVERTER IN DIGITAL RADIO COMMUNICATION SYSTEM

[75] Inventor: Jae-Sun Park, Ahnsan, Rep. of Korea

[73] Assignee: SamSung Electronics Co., Ltd., Suwon, Rep. of Korea

[21] Appl. No.: 08/718,906

[22] Filed: Sep. 24, 1996

[30] Foreign Application Priority Data

Sep. 26, 1995 [KR] Rep. of Korea .................. 95/31932

[51] Int. Cl.$^7$ .................. H03B 5/12; H03B 5/18
[52] U.S. Cl. .................. 331/179; 331/96; 331/117 R; 331/117 D; 331/175
[58] Field of Search .................. 331/36 C, 96, 331/117 R, 117 FE, 117 D, 175, 179

[56] References Cited

U.S. PATENT DOCUMENTS

| | | | |
|---|---|---|---|
| 4,066,983 | 1/1978 | Gallani et al. | 331/117 R |
| 4,091,339 | 5/1978 | Sugimoto et al. | 331/117 R |
| 4,169,248 | 9/1979 | Hongu et al. | 331/45 |
| 4,243,953 | 1/1981 | Balaban et al. | 331/117 R |
| 4,249,262 | 2/1981 | Fenk | 455/333 |
| 4,270,098 | 5/1981 | Bowman | 331/96 |
| 4,353,038 | 10/1982 | Rose et al. | 331/36 C |
| 4,450,416 | 5/1984 | Mears | 331/117 FE |
| 4,500,854 | 2/1985 | Meyer | 331/117 R |
| 4,533,881 | 8/1985 | Monett | 331/36 C |
| 4,593,255 | 6/1986 | Matsuura | 331/117 R |
| 4,602,222 | 7/1986 | Wynn | 331/179 |
| 4,621,241 | 11/1986 | Kiser | 331/117 R |
| 4,639,691 | 1/1987 | Iigima | 331/99 |
| 4,731,592 | 3/1988 | Sato et al. | 331/108 C |
| 5,107,228 | 4/1992 | Pham et al. | 331/117 R |
| 5,144,264 | 9/1992 | Chong et al. | 331/117 R |
| 5,258,726 | 11/1993 | Pham | 331/117 R |
| 5,486,796 | 1/1996 | Ishikawa et al. | 331/117 R |
| 5,686,864 | 11/1997 | Martin et al. | 331/1 A |

*Primary Examiner*—David Mis
*Attorney, Agent, or Firm*—Robert E. Bushnell, Esq.

[57] ABSTRACT

A voltage controlled oscillator for upconverter/downconverter in a digital radio communication system has an improved phase noise characteristic and includes: a resonance unit wherein a variable capacitance component is parallel-connected to a series resonance circuit, the variable capacitance component having a capacitance inversely proportional to the level of a control voltage in a preset range and the series resonance circuit having a series resonance point corresponding to the level of a mode voltage, and an oscillating unit for oscillating at a frequency corresponding to a parallel resonance point determined by the resonance unit.

22 Claims, 5 Drawing Sheets

*(Prior Art)*

VOLTAGE CONTROLLED OSCILLATOR FOR UPCONVERTER/DOWNCONVERTER IN DIGITAL RADIO COMMUNICATION SYSTEM

CROSS-REFERENCE TO RELATED APPLICATION

This application makes reference to, incorporates the same herein, and claims all benefits accruing under 35 U.S.C. §119 from an application for Voltage (Controlled Oscillator For Upconverter/Downconverter In Digital Radio Communication System earlier filed in the Korean Industrial Property Office on Sep. 26, 1995, and there duly assigned Ser. No. 31932/1995.

BACKGROUND OF THE INVENTION

1. Technical Field

The present invention relates to a voltage controlled oscillator and, more particularly, to a voltage controlled oscillator for an upconverter/downconverter for oscillating at a transmission local oscillating frequency during a transmission mode and at a reception local oscillating frequency during a reception mode, the transmission/reception modes being alternative with each other in a digital radio communication system.

2. Background Art

In early radio communication systems a frequency division multiple accessing (FDMA) scheme of an analog format was used to provide multiple and simultaneous transmission to a single transponder. The FDMA scheme permits carrier waves that are radiated from different earth stations to use the same satellite transponder and allows each carrier to be distinguished from the others when received at an earth station. Recently a code division multiple access (CDMA) scheme and a time division multiple access (TDMA) scheme of a digital format are becoming more popular in today's radio communication systems. For example a recently developed global system for mobile communication known as GSM is a digital communication system having a combination of FDMA and TDMA. Generally, GSM consists of many subsystems, such as a mobile station, a base station subsystem, a network and switching subsystem, and an operation subsystem. GSM has separate transmission and reception frequencies which are different depending upon respective active modes. For example, in the mobile station, the range of a downlink transmission frequency is 890–915 MHz and uplink reception frequency is 935–960 MHz which is generally 45MHz higher than the corresponding downlink transmission frequency. Both the 935–960 MHz uplink and 890–915 MHz downlink have been allocated 25 MHz. Accordingly the bandpass of the downlink transmission frequency is generally 25 MHz, and the frequency divided at intervals of 200 KHz for each voice band channel is used to dedicate to a single destination. Further, GSM operates in an alternative transmission mode and reception mode within each frame, i.e., within a time unit.

Typical GSM requires two separate voltage controlled oscillators (VCO) each used as a local oscillator for an upconverter which oscillates at a transmission frequency during a transmission mode and a local oscillator for a downconverter which oscillates at a reception frequency during a reception mode. Each of the voltage controlled oscillators (VCO) for an upconverter and a downconverter in the GSM typically provides a local oscillation frequency having a frequency range which varies linearly as a function of an input control voltage. Therefore the VCO must be designed for good linearity in generating a local oscillation frequency as a function of an input control voltage. In addition the VCO must be designed to operate at a broad range of frequency.

Conventional voltage controlled oscillators are available in frequencies ranging from audio frequencies to hundreds of megahertz. For example, simple LC-controlled oscillators have a tuned LC connected in an amplifier-like circuit to provide gain at its resonant frequency. Overall feedback is then used to cause a sustained oscillation to build up at the LC's resonant frequency. LC-controlled oscillators have two popular configurations such as the Colpitts oscillator, a parallel tuned LC at the input, with positive feedback from the output as disclosed, for example, in U.S. Pat. No. 4,593,255 for Varactor Tuned Colpitts Oscillator With Compensating Varactor For Wide Bandwidth issued to Matsuura, U.S. Pat. No. 4,621,241 for Wide Range Electronic. Oscillator issued to Kiser, U.S. Pat. No. 5,144,264 for Wideband Voltage Controlled Oscillator Having Open Loop Gain Compensation issued to Chong et al, and U.S. Pat. No. 5,486,790 for Oscillator Circuit For Receiving A Wide Frequency Band Signal issued to Ishikawa et al., and the Hartley oscillators disclosed, for example, in U.S. Pat. No. 4,091,339 for Oscillator issued to Sugimoto et al.

Tunable oscillator modules use varactors (voltage-variable capacitors) to adjust the operating frequency of an LC oscillator in response to an externally applied voltage may be found in U.S. Pat. No. 4,270,098 for Means For Linearizing A Voltage Variable Capacitor Controlled Oscillator issued to Bowman, U.S. Pat. No. 4,450,416 for Voltage Controlled Oscillator issued to Mears, U.S. Pat. No. 4,500,854 for Voltage-Controlled RF Oscillator Employing Wideband Tunable LC Resonator issued to Meyer, U.S. Pat. No. 4,533,881 for Rapid Starting Variable Frequency Oscillator With Minimum Startup Perturbations issued to Monett, U.S. Pat. No. 4,731,592 for Voltage Controllable Oscillator issued to Sato et al.

In the GSM, a conventional VCO is normally required as a local oscillator for each of an upconverter and a downconverter in a radio communication system. Recently, however, an integrated VCO has been designed for both the upconverter and the downconverter so as to reduce the size and cost of the communication system, as disclosed in Korean patent application No. 92-9028 for Voltage Controlled Oscillator, filed on May 27, 1992 by the same assignee, Samsung Electronics Ltd. as the present invention, and Korean patent application No. 94-15043, filed on Jun. 28, 1994 by the same assignee, Samsung Electronics Ltd. as the present invention which is now incorporated by reference herein for purposes of illustrating the state of the art. Generally, this type of VCO is used as a local oscillator for the upconverter during the signal transmission and for the downconverter during the signal reception. This type of VCO, however, has an unsatisfactory frequency range to cover both the transmission frequency bandpass and the reception frequency bandpass. While there are a number of known techniques for extending the range of oscillation frequency of the conventional VCO, I have found that none can minimize the phase noise. Moreover, when the range of oscillation frequency is extended, it is my observation that impedance of the frequency resonator and the negative resistance generator in the conventional LC oscillator must be unduly matched.

SUMMARY OF THE INVENTION

Accordingly, it is therefore an object of the present invention to provide an improved voltage controlled oscillator for an upconverter/downconverter in a radio communication system.

It is another object to provide an improved voltage controlled oscillator for an upconverter/downconverter in a radio communication for operation in a predetermined operating frequency range.

It is also an object to provide a voltage controlled oscillator for upconverter/downconverter in a digital radio communication system for generating a desirable oscillation frequency in a range usable for both signal transmission and reception but without extending, a range of variations in the oscillation frequency.

These and other objects of the present invention can be obtained by a voltage controlled oscillator for an upconverter/downconverter in a digital radio communication system, comprising a frequency resonator having first and second resonant circuits connected in parallel to an input terminal and a resonant terminal, and an oscillator connected to the resonant terminal for generating an oscillation frequency determined by the frequency resonator. The frequency resonator includes a first resonant circuit having a capacitance inversely proportional to a control voltage, and a second resonant circuit connected in parallel to said first resonant circuit having a resonant terminal corresponding to a mode voltage which varies by a unit of preset time and represents one of a transmission voltage for the upconverter during transmission and a reception voltage for the downconverter during reception. The oscillator includes a transistor having a collector, a base and an emitter with the emitter being coupled to provide the oscillation frequency; a first resistor coupled between base of the transistor and a first supply voltage terminal; a second resistor coupled in series with the first resistor and between base of the transistor and a second supply voltage terminal; a third resistor coupled between emitter of the transistor and the second supply voltage terminal; a first capacitor coupled between emitter of the transistor and the second resistor; a second capacitor coupled between emitter of the transistor and the second supply voltage terminal; a third capacitor coupled between the first and second supply voltage terminals; and a fourth capacitor coupled between emitter of the transistor and an output terminal providing the oscillation frequency.

As a first alternative embodiment, the frequency resonator includes; a first variable capacitance component having a first variable capacitance diode coupled between an input terminal and a resonant terminal with a capacitance inversely proportional to the level of said control voltage and a capacitor coupled between the input terminal and the resonant terminal, and a second variable capacitance component having a second variable capacitance diode with a capacitance inversely proportional to the level of a mode voltage representing one of a transmission voltage applied upon a transmission mode and a reception voltage applied upon a reception mode, and an inductor coupled between the second variable capacitance diode and the resonant terminal. An additional inductive component in a form of either an inductor or a dielectric resonator is connected in parallel to the input terminal and the resonant terminal. An adder is then included to receive an adjusting voltage for adjusting the mode voltage to control the frequency oscillated in the oscillator.

As another alternative embodiment, the frequency resonator includes a serially connected first and second variable capacitance components including a first capacitor coupled in series between an input terminal receiving a control voltage and a resonant terminal, a first variable capacitance diode coupled in series to the input terminal and having a capacitance inversely proportional to the level of the control voltage, a second capacitor coupled in series to the first variable capacitance diode, and a second variable capacitance diode coupled in series to the second capacitor and having a capacitance inversely proportional to the level of the mode voltage representing one of a transmission voltage applied upon a transmission mode and a reception voltage applied upon a reception mode. An additional inductive component in a form of an inductor or a dielectric resonator is connected in parallel to the serially connected first and second variable capacitance components and a resonant terminal. An adder is also included to receive an adjusting voltage for adjusting the mode voltage to control the frequency oscillated in the oscillator.

The present invention is more specifically described in the following paragraphs by reference to the drawings attached only by way of example.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
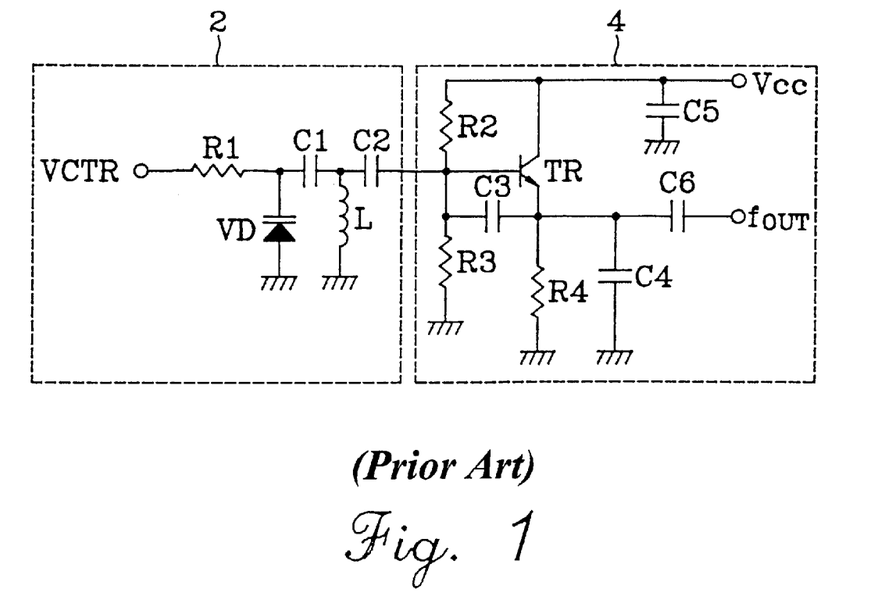
FIG. 1 is an abstract representation of a voltage controlled oscillator for an upconverter/downconverter of a radio communication system.

Referring now to the drawings and particularly to FIG. 1, which is an abstract representation of a voltage controlled oscillator as disclosed in Korean patent application No.

92-9028 for Voltage Controlled Oscillator, filed on May 27, 1992 by the same assignee, Samsung Electronics Ltd. as the present invention, and Korean patent application No. 94-15043, filed on Jun. 28, 1994 by the same assignee, Samsung Electronics Ltd. as the present invention, which is now incorporated herein by reference for purposes of illustrating the state of the art. The typical voltage controlled oscillator includes a frequency resonator 2 and a negative resistance generator 4. The frequency resonator 2 is constructed by a LC parallel resonance circuit having a varactor diode VD where a capacitance varies in correspondence with an input control voltage VCTR, connected in series with capacitor C1 to form a single variable capacitance component, and an inductor L as an inductive component connected in parallel to the variable capacitance component. The negative resistance generator 4 includes a transistor TR and feedback capacitors C3 and C4, respectively connected between an emitter of the transistor TR and a base thereof, and between the emitter thereof and a ground terminal. Here, the negative resistance generator 4 generates a resistance of the frequency resonator 2, i.e., a negative resistance for removing a factor of the power loss. In addition, the negative resistance generator 4 acts as an oscillator for generating an output oscillation frequency $f_{OUT}$ having a resonance frequency determined by the frequency resonator 2.

Referring to FIG. 1, R1 represents resistor for coupling an input (control voltage VCTR to a variable capacitance component which includes a varactor diode VD connected in series to capacitor C1. C2 represents capacitor for coupling the LC parallel resonance circuit to transistor TR. R2 and R3 are bias resistors for respectively dividing a power supply voltage Vcc into voltages of a given level and providing the divided voltage as bias to transistor TR. R4 is an emitter resistor of the transistor TR. C5 represents capacitor connected between a collector of the transistor TR and a ground terminal so as to remove power noise. C6 represents capacitor connected between an emitter of the transistor TR and an output terminal so as to charge and discharge direct current DC, and four represents an output oscillation frequency of the VCO after passing the input control voltage VCTR through the frequency resonator 2 and the negative resistance generator 4.

As shown in FIG. 1, when an input control voltage VCTR is applied to the VCO constructed with the frequency resonator 2 and the negative resistance generator 4, the capacitance Cd of the varactor diode VD as well as the resonance frequency of the LC parallel resonance circuit constructed with the varactor diode VD, the capacitor C1 and the inductor L vary as a function of the variation of a backward voltage Vd applied to an anode of the varactor diode VD. As a result, the oscillation frequency $f_{OUT}$ can be varied accordingly. Usually, the capacitance Cd of the varactor diode VD may be reduced inversely proportional to the increment of the backward voltage Vd applied to the anode of the varactor diode VD.

Figure 2:
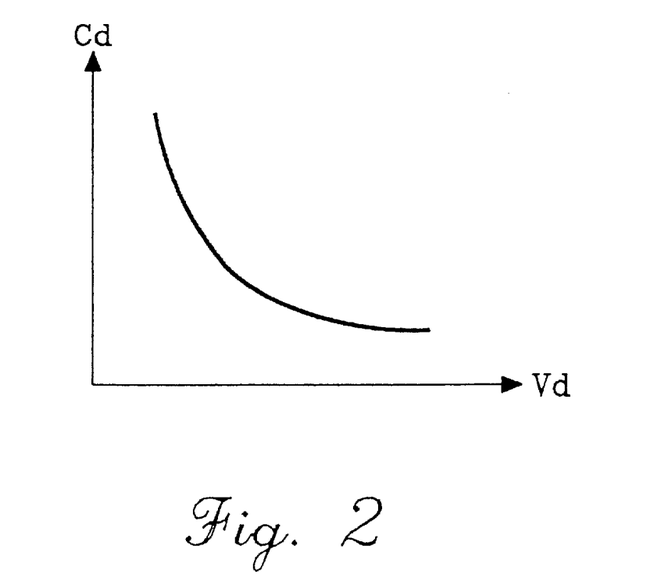
FIG. 2 illustrates variations in capacitance Cd of a varactor diode by an input control voltage Vd applied to the voltage controlled oscillator of FIG. 1.

FIG. 2 illustrates variations in a capacitance of a varactor diode by an input control voltage VCTR applied to the frequency resonator of FIG. 1.

Figure 3A:
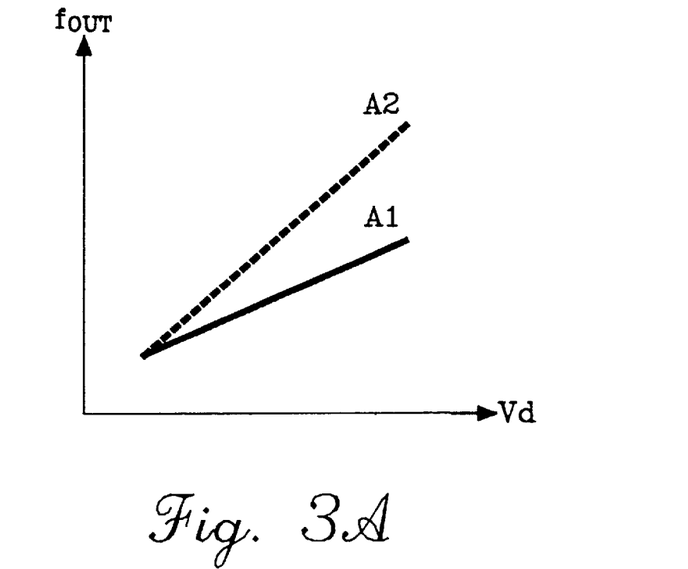
FIGS. 3A and 3B illustrate variations in an oscillation frequency as a function of an input control voltage applied to the voltage controlled oscillator of FIG. 1.
Figure 3B:
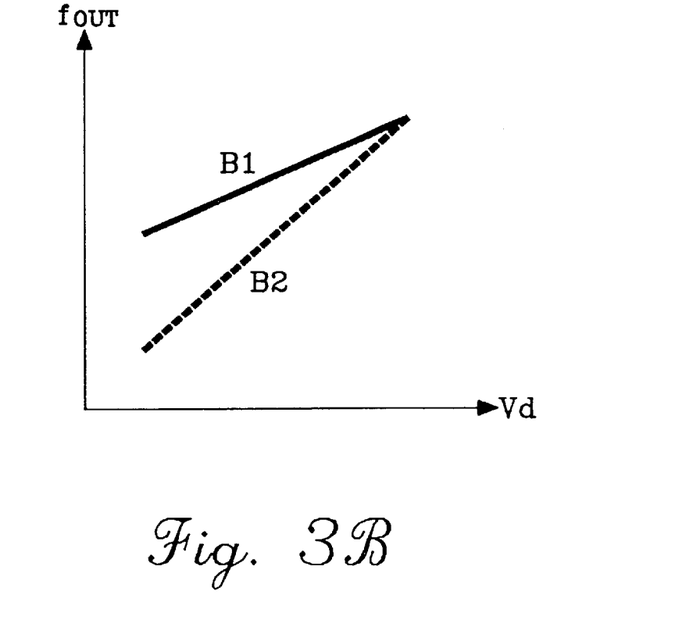

In the GSM, however, a typical VCO as shown in FIG. 1 is normally used as a local oscillator for each of an upconverter and a downconverter in a radio communication system. Recently, an integrated VCO is designed for both the upconverter and the downconverter so as to reduce the size and cost of the communication system as disclosed in Korean patent application No. 95-8687 filed on Apr. 13, 1995 and its corresponding U.S. patent application Ser. No. 08/630,825 for Transmission And Reception Apparatus Having A Single Phase-Locked Loop And Method Whereof filed on Apr. 10, 1996 by the same assignee, Samsung Electronics Ltd. as the present invention which is incorporated by reference herein for purposes of illustrating the state of the art. Generally, this type of VCO is used as a local oscillator for the upconverter during the signal transmission and for the downconverter during the signal reception. This type of VCO, however, has an unsatisfactory frequency range to cover both the transmission frequency bandpass and the reception frequency bandpass. For instance, when the characteristic of the variations in an output oscillation frequency versus an input control voltage VCTR in the VCO as the local oscillator for an upconverter is the same as shown by curve A1 of FIG. 3A, the range of variations in the oscillation frequency four in the VCO as the local oscillator for upconverter/downconverter must be extended as shown by curve A2 of FIG. 3A. Similarly, when the characteristic of the variations in the output oscillation frequency versus the input control voltage VCTR in the VCO as the local oscillator for a downconverter is the same as shown by curve B1 of FIG. 3B, the range of variations in the oscillation frequency $f_{OUT}$ in the VCO as the local oscillator for upconverter/downconverter must be extended as shown by curve B2 of FIG. 3B. While there are a number of known techniques for extending the range of oscillation frequency of the typical VCO as shown in FIG. 1, I have found that none is sufficient to minimize the phase noise. Moreover, when the range of oscillation frequency is extended, it is my observation that impedance of the frequency resonator and the negative resistance generator in the conventional LC oscillator must be unduly matched.

Figure 4:
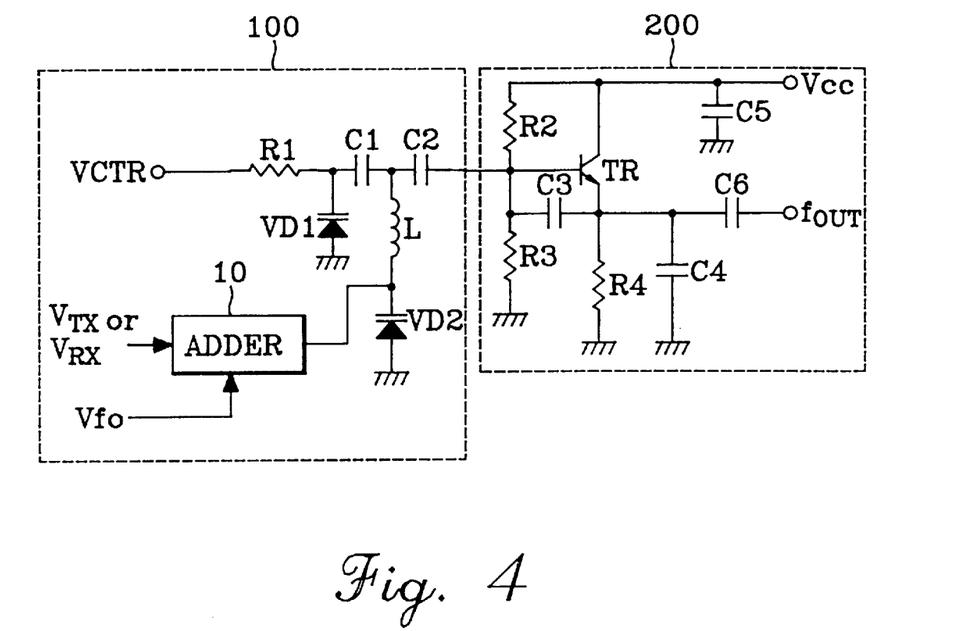
FIG. 4 illustrates a voltage controlled oscillator constructed according to the principles of the present invention.

Turning now to FIG. 4 which illustrates an improved voltage controlled oscillator constructed according to the principles of the present invention. The voltage controlled oscillator contains a frequency resonator 100 including an additional varactor diode VD2 and an adder 10, and a negative resistance generator 200. Capacitor C1 and varactor diode VD1 included in the frequency resonator 100 form a variable capacitance component having a capacitance inversely proportional to an input control voltage VCTR. Inductor L and varactor diode VD2 form a series resonance circuit having a series resonance point varied in accordance with a voltage signal provided from an adder 20. Collectively, the frequency resonator 100 constitutes a parallel resonance circuit.

Figure 5:
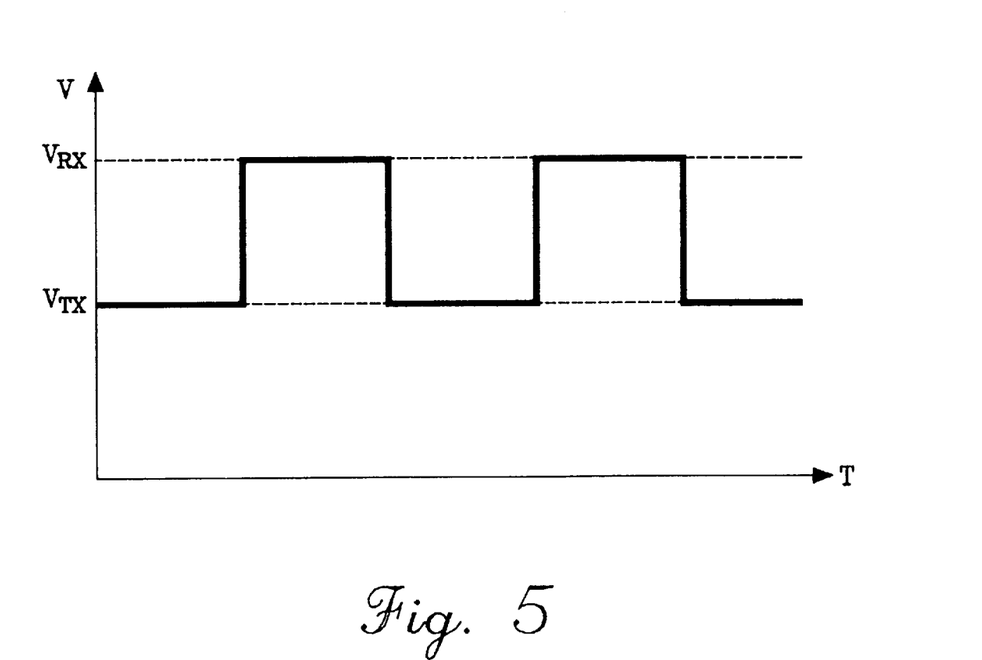
FIG. 5 is a waveform diagram illustrating a mode voltage applied to an adder of the voltage controlled oscillator constructed according to the principles of the present invention during an active mode.

FIG. 5 is a waveform diagram illustrating variations in a mode voltage applied to the adder 10 of the frequency resonator as shown in FIG. 4 according to an active mode in which a transmission mode voltage $V_{TX}$ and a reception mode voltage $V_{RX}$ are reciprocally applied.

Figure 6:
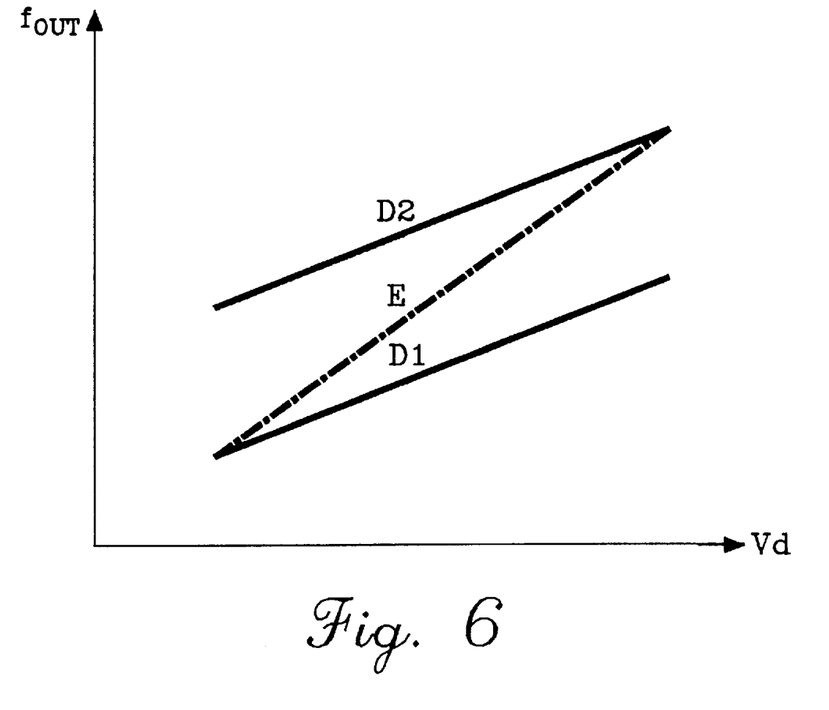
FIG. 6 illustrates variations in an oscillation frequency as a function of an input control voltage applied to the voltage controlled oscillator constructed according to the principles of the present invention.

FIG. 6 is a characteristic curve illustrating variations in an oscillation frequency $f_{OUT}$ as a function of an input control voltage VCTR applied to the voltage controlled oscillator of FIG. 4.

When the control voltage VCTR is applied to a first varactor diode VD1 through resistor R1, the capacitance of the varactor diode VD1 as shown by the characteristic curve of FIG. 2 is varied in an inverse proportion with the applied control voltage VCTR. Meanwhile, another varactor diode VD2 is also varied in an inverse proportion with the applied control voltage VCTR. Inductor L and varactor diode VD2 are connected in series to form a series resonance circuit. Capacitor C1 and varactor diode VD1 are connected in parallel to form a parallel resonance circuit. Likewise, while the inductor L of the series resonance circuit utilizes a lumped element such as a coil at low frequency, it can be made by applying a microstrip line or a strip line at high frequency. Conventionally, in the digital radio communication system, the micro strip line or the strip line is utilized as inductor L. In the parallel resonance circuit formed as described, once the capacitance of the varactor diode VD1 is varied as a function of an input control voltage VCTR, the parallel resonance point of the frequency resonator 100 may be varied, so that the oscillation frequency $f_{OUT}$ of the negative resistance generator 200 as an oscillator can be varied accordingly.

With the increase of the capacitance of the capacitor C1 in the frequency resonator 100, the range of variations in the oscillation frequency $F_{OUT}$ is increased due to the applied control voltage VCTR. By contrast, when the capacitance of the capacitor C1 in the frequency resonator 100 is decreased, the range of variations in the oscillation frequency $f_{OUT}$ is also decreased by relatively reducing the variation of the capacitance of the varactor diode VD1 due to the applied control voltage VCTR. That is, the range of variations in the oscillation frequency $f_{OUT}$ of the VCO is mainly due to the capacitance of the capacitor C1. Also, the series resonance circuit comprising the inductor L and the varactor diode VD2 is provided to enable the oscillation frequency $f_{OUT}$ in the VCO to be varied with the variation of the series resonance point due to the variation of the capacitance of the varactor diode VD2. The voltage applied to the varactor diode VD2 is provided from an output ($V_{TX}$ or $V_{RX}$) of an adder 10. Vfo represents a voltage for fine adjustment of the oscillation frequency $f_{OUT}$ generated by the variations of all components of the VCO, and $V_{TX}$ or $V_{RX}$ represents a voltage for switching a central frequency in the VCO upon the transmission mode and upon the reception mode.

As shown in FIG. 5, the voltage $V_{TX}+V_{fo}$ upon the transmission mode is applied through the adder 10 to the varactor diode VD2 and the voltage $V_{RX}+V_{fo}$ upon the reception mode is applied through the adder 10 to the varactor diode VD2. Thus, the capacitance corresponding to the voltage applied upon each mode is generated. Consequently, during the transmission mode, the series resonance circuit comprising the inductor L and the varactor diode VD2 has a resonance point corresponding to the transmission mode. During the reception mode, the series resonance circuit has a resonance point corresponding to the reception mode. In other words, the series resonance frequency is determined differently according to the transmission mode and the reception mode. For this reason, since the capacitance of the varactor diode VD1 is varied by the control voltage VCTR, the characteristic curve of the variations in the oscillation frequency $f_{OUT}$ versus the backward voltage is obtained as shown by curves D1 and D2 of FIG. 6.

Refer back to FIG. 4, the negative resistance generator 200 is connected with the frequency resonator 100 through coupling capacitor C2, capacitors C3 and C4 are designated as feedback capacitors, and resistors R2, R3 and R4 are designated as bias resistors of the transistor TR, capacitor C6 being represented to disclose the DC direct current power for outputting the oscillation frequency $f_{OUT}$, capacitor C5 being represented to remove the noise included in the power supply voltage Vcc. Substantially, the oscillation frequency $f_{OUT}$ is generated due to reciprocal action by combination of the frequency resonator 100 and the negative resistance generator 200. Thus, inasmuch as the detailed description of the above operation corresponds to known function and constructions, it will be apparent, however, to one skilled in the art that the invention may be practiced without these additional specific details.

As described above, in the digital radio communication system such as the GSM using a TDMA scheme with separate transmission frequency and reception frequency, when the VCO is used as the local oscillator for upconverter/downconverter, the characteristic curve of the variations in the oscillation frequency versus the control voltage applied to the VCO is shown by curves D1 and D2 of FIG. 6 with applying the mode voltage as shown in FIG. 5 to the VCO. As a result, the range of the oscillation frequency is different depending upon the transmission mode and the reception mode. That is, the curve D1 of FIG. 6 corresponds to the characteristic curve of the variations in the oscillation frequency versus the control voltage upon the transmission mode and curve D2 of FIG. 6 corresponds to the characteristic curve of the variations in the oscillation frequency versus the control voltage upon the reception mode. In the GSM, when an intermediate frequency for transmission is 264 MHz and the range of the transmitting frequency is approximately 980–915 MHz, the local oscillation frequency for upconverter upon the transmission mode requires the variations in the frequency corresponding to 264 MHz + (980–915 MHz)=1154–1179 MHz. In addition, when an intermediate frequency for reception is 244 MHz and the range of the receiving frequency is approximately 935–960 MHz, local oscillation frequency for upconverter upon the reception mode requires the variations in the frequency corresponding to 244 MHz + (935–960 MHz)=1179–1204 MHz. Accordingly, in order to use the VCO as the local oscillator for upconverter/downconverter, the variations in the frequency corresponding to 1154–1204 MHz must be required.

When the VCO as shown in FIG. 1 is used as the local oscillator for upconverter/downconverter, the variations in the oscillation frequency having an extended range as shown by curve E of FIG. 6 must necessarily be required. However, when the VCO constructed according to the principles of the present invention as shown in FIG. 4 is used as the local oscillator for upconverter/downconverter, the variations in the oscillation frequency having a range narrower than that shown by curve E of FIG. 6, is required as shown by curves D1 and D2 of FIG. 6. Because the range of the variations in the oscillation frequency is broad, the variations in the oscillation frequency can easily be influenced and the phase noise characteristic of tie VCO can be deteriorated by external noise. Since the VCO as constructed according to the principles of the present invention is designed with a narrow range of the variations in the oscillation frequency to sufficiently cover both the transmission frequency bandpass and the reception frequency bandpass, the phase noise characteristic of the VCO is infinitely improved.

Figure 7:
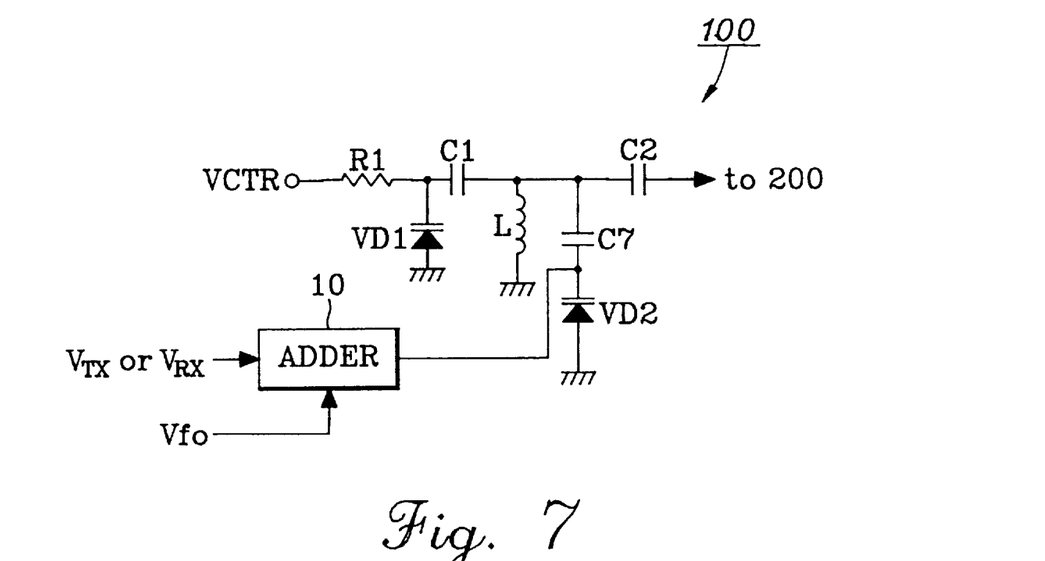
FIG. 7 illustrates a first alternative embodiment of a frequency resonator of the voltage controlled oscillator constructed according to the principles of the present invention.

FIG. 7 illustrates a first alternative embodiment of a frequency resonator 100 of the VCO constructed according to the principles of the present invention. In this embodiment, the frequency resonator 100 contains a first variable capacitance component including capacitor C1 and varactor diode Vd1 connected to an input terminal via resistor R1, a second variable capacitance component including capacitor C7 and varactor diode VD2 connected to the first variable capacitance component, and an inductor L connected in parallel with the first and second variable capacitance components.

When an input control voltage VCTR is applied to the varactor diode VD1, the capacitance of the varactor diode VD1 is determined in correspondence with the applied control voltage VCTR. That is, the capacitance of the varactor diode Vd1 is determined in an inverse proportion with the control voltage VCTR. In addition, the adder 10 adds an adjusting voltage $V_{fo}$ of the oscillation frequency $f_{OUT}$ to the transmission mode voltage $V_{TX}$ or the reception mode voltage $V_{RX}$ and produces an output voltage to be applied to the varactor diode VD2. In this case, the capacitance of the varactor diode VD2 is determined inversely proportional to the output; voltage of the adder 10. As described above, since the capacitances of the varactor diodes are determined by the control voltage VCTR and the output voltage of the adder 10, and the resonance point of the parallel resonance circuit is determined by the inductance of the inductor L, the negative resistance generator 200 oscillates the oscillation frequency $f_{OUT}$ corresponding to the determined resonance point.

Figure 8:
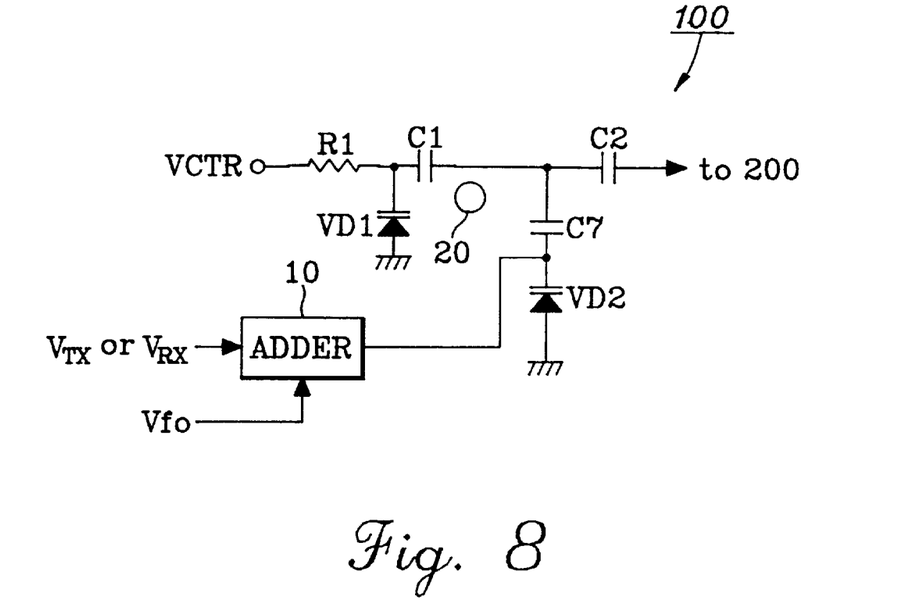
FIG. 8 illustrates a second alternative embodiment of a frequency resonator of the voltage controlled oscillator constructed according to the principles of the present invention.

FIG. 8 illustrates a second alternative embodiment of a frequency resonator 100 of the VCO constructed according to the principles of the present invention. In this embodiment, the frequency resonator 100 also contains a first variable capacitance component including capacitor C1 and varactor diode Vd1, and a second variable capacitance component including capacitor C7 and varactor diode VD2 similar to that shown in FIG. 7. However, an additional dielectric resonator 20 serving as an inductive component is connected in parallel to the first and second variable capacitance components to form a parallel resonance circuit. The operational characteristic of the VCO remains, however, substantially the same as that of FIG. 7.

Figure 9:
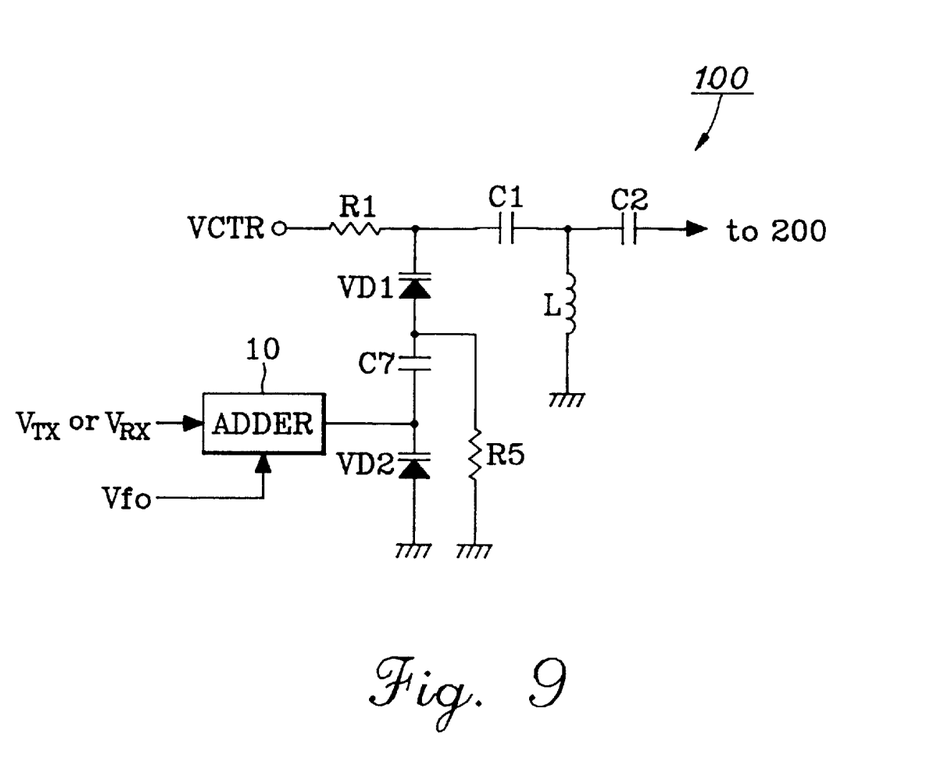
FIG. 9 illustrates a third alternative embodiment of a frequency resonator of the voltage controlled oscillator constructed according to the principles of the present invention.

FIG. 9 illustrates a third alternative embodiment of a frequency resonator 100 of the VCO constructed according to the principles of the present invention. In this embodiment, the frequency resonator 100 includes capacitor C1, varactor diode VD1, capacitor C7 and varactor diode VD2 connected in series to form a series connecting circuit. Inductor L1 is connected in parallel to the series connecting circuit, and resistor R5 is connected in parallel to the varactor diode VD2 and the capacitor C7. The frequency resonator 100 also includes an adder 10 for adding a minute adjusting voltage $V_{fo}$ of the oscillation frequency $F_{OUT}$ to the transmission mode voltage $V_{TX}$ or the reception mode voltage $V_{RX}$, and supplying an output voltage to the varactor diode VD2. In this case, the capacitance of the varactor diode VD2 is determined by the output voltage of the adder 10. That is, the capacitance of the varactor diode VD2 is determined inversely proportional to the output voltage of the adder 10. As described above, the control voltage VCTR is applied to the varactor diode VD1 in the state where the capacitance of the varactor diode VD2 is determined. Then, the capacitance of the varactor diode Vd1 is determined by the applied control voltage VCTR. That is, the capacitance of the varactor diode Vd1 is determined inversely proportional to the control voltage VCTR, so that the capacitor C1, the varactor diode VD1, the capacitor C7, and the varactor diode VD2 can be determined accordingly. Again, since the parallel resonance point of the parallel resonance circuit is determined by the inductance of the inductor L and the capacitance, the negative resistance generator 200 oscillates the oscillation frequency $f_{OUT}$ corresponding to the determined parallel resonance point. In the embodiment as shown in FIG. 9, the dielectric resonator of FIG. 8 can be used in lieu of the inductor L.

As apparent from the foregoing, the present invention advantageously provides a voltage controlled oscillator that is capable of generating a local oscillation frequency for an upconverter/downconverter in a digital radio communication system during both the transmission mode and reception mode without extending or enlarging the range of variations in the oscillation frequency.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof Therefore, it is intended that the present invention not be limited to the particular embodiment disclosed as the best mode contemplated for carrying out the present invention, but that the present invention includes all embodiments falling within the scope of the appended claims.

What is claimed is:

1. A voltage controlled oscillator for an upconverter/downconverter in a digital radio communication system, comprising:

a frequency resonator having first and second circuits connected in parallel, said first and second circuits being connected to an input terminal, said first circuit having a capacitance inversely proportional to a control voltage, and said second circuit having a mode voltage terminal for receiving a voltage which represents one of a transmission voltage for said upconverter during transmission and a reception voltage for said downconverter during reception and having a capacitance inversely proportional to said mode voltage; and an oscillator circuit connected to said frequency resonator for generating an oscillation frequency determined by said frequency resonator.

2. The voltage controlled oscillator of claim 1, said first circuit comprising:

a variable capacitance diode coupled to said input terminal and having a capacitance inversely proportional to the level of said control voltage; and a capacitor coupled between said input terminal and said mode voltage terminal.

3. The voltage controlled oscillator of claim 1, said second circuit comprising:

a variable capacitance diode having a capacitance inversely proportional to said mode voltage representing one of said transmission voltage applied upon a transmission mode and said reception voltage applied upon a reception mode; and an inductor coupled between said variable capacitance diode and said mode voltage terminal.

4. The voltage controlled oscillator of claim 3, said second circuit comprising an adder for receiving said mode voltage and an adjusting voltage for adjusting said mode voltage for controlling said oscillation frequency of said oscillator circuit.

5. The voltage controlled oscillator of claim 1, said oscillator circuit comprising:

a first supply voltage terminal;

a second supply voltage terminal;

a transistor having a first electrode of a principal electrically conducting channel, a second electrode of said principal electrically conducting channel, and a control electrode, said control electrode regulating a current flow between said first electrode and said second electrode of said principal electrically conducting channel, said first electrode being coupled to provide said oscillation frequency;

a first resistor coupled between said control electrode of said transistor and said first supply voltage terminal;

a second resistor coupled in series with said first resistor and between said control electrode of said transistor and said second supply voltage terminal;

a third resistor coupled between said first electrode of said transistor and said second supply voltage terminal;

a first capacitor coupled between said first electrode of said transistor and said second resistor;

a second capacitor coupled between said first electrodes of said transistor and said second supply voltage terminal;

a third capacitor coupled between said first supply voltage terminal and said second voltage terminal; and a fourth capacitor coupled between said first electrode of said transistor and an output terminal providing said oscillation frequency.

6. The voltage controlled oscillator of claim 1, said second circuit comprising:

a variable capacitance diode having a capacitance inversely proportional to the level of said mode voltage representing one of said transmission voltage applied upon a transmission mode and said reception voltage applied upon a reception mode; and a capacitor coupled between said variable capacitance diode and said mode voltage terminal.

7. The voltage controlled oscillator of claim 6, said frequency resonator comprising an inductor coupled in parallel to said first and second circuits.

8. The voltage controlled oscillator of claim 6, said frequency resonator comprising a dielectric resonator coupled in parallel to said first and second circuits.

9. The voltage controlled oscillator of claim 7, said oscillator circuit comprising:

a first supply voltage terminal;

a second supply voltage terminal;

a transistor having a first electrode of a principal electrically conducting channel, a second electrode of said principal electrically conducting channel, and a control electrode, said control electrode regulating a current flow between said first electrode and said second electrode of said principal electrically conducting channel, said first electrode being coupled to provide said oscillation frequency;

a first resistor coupled between said control electrode of said transistor and said first supply voltage terminal;

a second resistor coupled in series with said first resistor and between said control electrode of said transistor and said second supply voltage terminal;

a third resistor coupled between said first electrode of said transistor and said second supply voltage terminal;

a first capacitor coupled between said first electrode of said transistor and said second resistor;

a second capacitor coupled between said first electrode of said transistor and said second supply voltage terminal;

a third capacitor coupled between said first supply voltage terminal and said second voltage terminal; and a fourth capacitor coupled between said first electrode of said transistor and an output terminal providing said oscillation frequency.

10. A voltage controlled oscillator for upconverter/downconverter in a digital radio communication system, comprising:

a frequency resonator having a first variable capacitance component, a second variable capacitance component, an inductive component connected to an input terminal for receiving a control voltage and a first terminal, said first variable capacitance component having a capacitance inversely proportional to said control voltage and said second variable capacitance component having a capacitance inversely proportional to a mode voltage which represents one of a transmission voltage for said upconverter during transmission and a reception voltage for said downconverter during reception; and an oscillator circuit coupled to said first terminal, for generating an oscillation frequency in response to said frequency resonator.

11. The voltage controlled oscillator of claim 10, said first variable capacitance component comprising:

a variable capacitance diode coupled between said input terminal and said first terminal, and having a capacitance inversely proportional to the level of said control voltage; and a capacitor coupled between said input terminal and said first terminal.

12. The voltage controlled oscillator of claim 10, said second variable capacitance component comprising:

a variable capacitance diode having a capacitance inversely proportional to the level of said mode voltage representing one of said transmission voltage applied upon a transmission mode and said reception voltage applied upon a reception mode; and an inductor coupled between said variable capacitance diode and said first terminal.

13. The voltage controlled oscillator of claim 10, said second variable capacitance component comprising an adder for receiving said mode voltage and an adjusting voltage for adjusting said mode voltage for controlling said oscillation frequency of said oscillator circuit.

14. The voltage controlled oscillator of claim 10, said oscillator circuit comprising:

a first supply voltage terminal;

a second supply voltage terminal;

a transistor having a first electrode of a principal electrically conducting channel, a second electrode of said principal electrically conducting channel, and a control electrode, said control electrode regulating a current flow between said first electrode and said second electrode of said principal electrically conducting channel, said first electrode being coupled to provide said oscillation frequency;

a first resistor coupled between said control electrode of said transistor and said first supply voltage terminal;

a second resistor coupled in series with said first resistor and between said control electrode of said transistor and said second supply voltage terminal;

a third resistor coupled between said first electrode of said transistor and said second supply voltage terminal;

a first capacitor coupled between said first electrode of said transistor and said second resistor;

a second capacitor coupled between said first electrode of said transistor and said second supply voltage terminal;

a third capacitor coupled between said first supply voltage terminal and said second voltage terminal; and a fourth capacitor coupled between said first electrode of said transistor and an output terminal providing said oscillation frequency.

15. The voltage controlled oscillator of claim 10, said inductive component comprising an inductor.

16. The voltage controlled oscillator of claim 10, said inductive component comprising a dielectric resonator.

17. A voltage controlled oscillator for upconverter/downconverter in a digital radio communication system, comprising:

a frequency resonator comprising a serially connected first and second variable capacitance components, an inductive component connected in parallel to said serially connected first and second variable capacitance components and a first terminal, said first variable capacitance component having a capacitance inversely proportional to a control voltage and said second variable capacitance component having a capacitance inversely proportional to a mode voltage which represents one of a transmission voltage for said upconverter during transmission and a reception voltage for said downconverter during reception; and an oscillator circuit connected to said first terminal, for generating an oscillation frequency, said oscillator circuit comprising:
  a first supply voltage terminal;
  a second supply voltage terminal;
  a transistor having a first electrode of a principal electrically conducting channel, a second electrode of said principal electrically conducting channel, and a control electrode, said control electrode regulating a current flow between said first electrode and said second electrode of said principal electrically conducting channel, said first electrode being coupled to provide said oscillation frequency;
  a first resistor coupled between said control electrode of said transistor and said first supply voltage terminal;
  a second resistor coupled in series with said first resistor and between said control electrode of said transistor and said second supply voltage terminal;
  a third resistor coupled between said first electrode of said transistor and said second supply voltage terminal;
  a first capacitor coupled between said first electrode of said transistor and said second resistor;
  a second capacitor coupled between said first electrode of said transistor and said second supply voltage terminal;
  a third capacitor coupled between said first supply voltage terminal and said second voltage terminal; and
  a fourth capacitor coupled between said first electrode of said transistor and an output terminal providing said oscillation frequency.

18. The voltage controlled oscillator of claim 17, said serially connected first and second variable capacitance components comprising:
  a first capacitor coupled in series between an input terminal receiving said control voltage and said first terminal;
  a first variable capacitance diode coupled in series to said input terminal and having a capacitance inversely proportional to said control voltage;
  a second capacitor coupled in series to said first variable capacitance diode; and
  a second variable capacitance diode coupled in series to said second capacitor and having a capacitance inversely proportional to said mode voltage representing one of said transmission voltage applied upon a transmission mode and said reception voltage applied upon a reception mode.

19. The voltage controlled oscillator of claim 17, said frequency resonator comprising an adder for receiving said mode voltage and an adjusting voltage for adjusting said mode voltage for controlling said oscillation frequency od said oscillator circuit.

20. The voltage controlled oscillator of claim 19, wherein said first variable capacitance component is reverse biased by said control voltage and said second variable capacitance component is reverse biased by a sum of said mode voltage and said adjusting voltage.

21. The voltage controlled oscillator of claim 17, said inductive component comprising an inductor.

22. The voltage controlled oscillator of claim 17, said inductive component comprising a dielectric resonator.

* * * * *